United States Patent [19]

Smith

[11] Patent Number: 4,496,858
[45] Date of Patent: Jan. 29, 1985

[54] FREQUENCY TO VOLTAGE CONVERTER

[75] Inventor: Michael D. Smith, Austin, Tex.

[73] Assignee: Motorola, Inc., Schaumburg, Ill.

[21] Appl. No.: 599,595

[22] Filed: Apr. 13, 1984

Related U.S. Application Data

[63] Continuation of Ser. No. 334,279, Dec. 24, 1981, abandoned.

[51] Int. Cl.³ .................... H03K 5/22; H03K 5/00
[52] U.S. Cl. .................... 307/519; 328/127; 328/151; 330/107; 330/9
[58] Field of Search ............. 328/127, 151, 167; 307/497, 519, 577; 330/9, 107, 109

[56] References Cited

U.S. PATENT DOCUMENTS

| | | |
|---|---|---|
| 4,179,665 | 12/1979 | Gregorian ............... 328/167 |
| 4,210,872 | 7/1980 | Gregorian ............... 330/107 |
| 4,306,197 | 12/1981 | Gregorian ............... 330/107 |
| 4,329,599 | 5/1982 | Gregorian et al. ........ 307/497 |
| 4,331,894 | 5/1982 | Gregorian et al. ........ 307/577 |
| 4,425,550 | 1/1984 | Smith et al. ............. 330/107 |

OTHER PUBLICATIONS

IEEE Journal of Solid State Circuits, vol. SC-12, No. 6, Dec. 1977, pp. 600–608, "MOS Sampled Data Recursive Filters Using Switched Cap. Integrators", Hosticka et al.

Primary Examiner—Stanley D. Miller
Assistant Examiner—Timothy P. Callahan
Attorney, Agent, or Firm—Anthony J. Sarli, Jr.

[57] ABSTRACT

A frequency to voltage converter is described which utilizes an operational amplifier connected as a damped integrator and having a switched capacitive input and feedback element. If the capacitors are equal in size, the output voltage is a function of the ratio of the switching frequencies of the switched capacitors.

3 Claims, 4 Drawing Figures

FREQUENCY TO VOLTAGE CONVERTER

This is a continuation of application Ser. No. 334,279, filed Dec. 24, 1981, and now abandoned.

TECHNICAL FIELD

This invention relates to frequency to voltage converters usable in integrated circuits, and more particularly to frequency to voltage converters utilizing switched capacitor techniques to provide tightly controllable tolerances in an integrated circuit embodiment.

BACKGROUND ART

Frequency to voltage converters are used in many functions, such as phase-locked loops and tracking filters, designed for integration onto integrated circuits.

In the past, frequency to voltage converters have primarily relied upon RC networks in their design. Since resistors have a relatively poor tolerance factor in MOS integrated circuits, and are sensitive to process variations, such RC based designs were not acceptable where precision was required or, alternatively, off-chip resistors were used in the circuits.

BRIEF SUMMARY OF THE INVENTION

The invention of the instant application is intended to rectify the above disadvantages of the prior art circuit. This is accomplished by utilizing, in several embodiments, switched capacitive devices as substitutes for resistors, and for additionally utilizing sized capacitors switched at a frequency such as to produce the desired voltage output as a function of frequency.

DETAILED DESCRIPTION OF A PREFERRED EMBODIMENT

Figure 1:
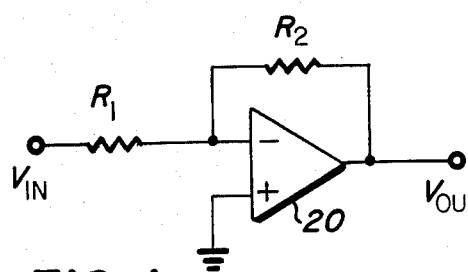
FIG. 1 shows an operational amplifier with a resistive feedback path as is well known in the prior art.

FIG. 1 shows a conventional operational amplifier 20 as is known in the prior art, wherein the amplifier 20 has a feedback resistance $R_2$, an input resistance $R_1$ which is connected to an input voltage source, and the output is taken off the output of the operational amplifier.

As is well known, the gain of such a circuit may be represented by the formula $V_{out}/V_{in} = -R_2/R_1$ or $V_{out} = -R_2 \times V_{in}/R_1$. Thus, the gain of such a circuit is a function of the ratio of the two resistive elements therein.

Figure 2:
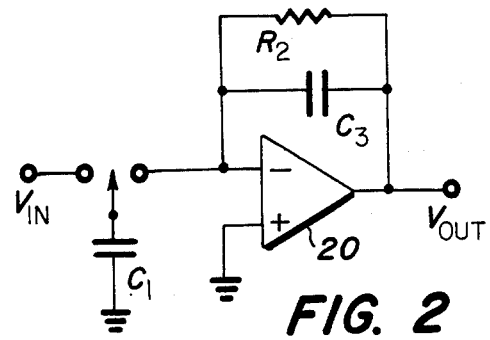
FIG. 2 is a circuit using an operational amplifier and having a switched-capacitor input.

As previously noted, resistors have a poor tolerance factor in integrated circuit design since variations in resistance are introduced by process variations. Therefore, the circuit shown in FIG. 1 may be improved by substituting a switched capacitor for the input resistor $R_1$ as shown in FIG. 2. This circuit will generate a stable output voltage that is directly proportional to the switching frequency of the capacitor. The slope of the characteristic ($V_{out}/f_{Cl}$) can be varied by varying the size of the switched capacitor, the input (reference) voltage, or the feedback resistor.

As can be seen, the circuit uses a damped integrator for its gain element. The capacitor $C_3$ is necessary in this implementation to absorb the current burst when $C_1$ is switched to the input of the operational amplifier 20. With a DC reference voltage or input voltage, the switched capacitor circuit in the input path simulates a resistor with an effective value of: $R_{EFF} = 1/f_c C_1$ where $f_c$ = clock frequency. Utilizing the same formula as set forth with respect to FIG. 1, for the circuit for FIG. 2:

$$V_{out} = -f_c C_1 R_2 V_{ref}.$$

In operation, the capacitor $C_1$ is switched first to the reference voltage level $V_{in}$, and the capacitor is charged to $V_{ref}$. The capacitor is then switched to the input of the operational amplifier and the charge on the capacitor is transferred to that input. Since the operational amplifier itself is connected as a damped integrator, the successive charges transferred from $C_1$ to the input of the operational amplifier as $C_1$ is switched a plurality of times, accumulates as a charge on capacitor $C_3$.

It can be seen that the voltage characteristic of this device is linearly dependent on the switching frequency of the input capacitor $C_1$. Because of the presence of the feedback resistor $R_2$, however, the voltage characteristic is also dependent on an RC product ($R_2 C_2$), which, again, has a poor tolerance in integrated circuit design.

Figure 3:
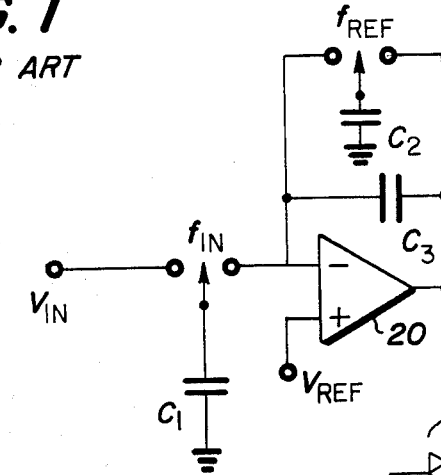
FIG. 3 is a circuit similar to that of FIG. 2, but additionally employing a switched-capacitor feedback loop and a sample-and-hold output.

In FIG. 3, the resistor $R_2$ is replaced by a second switched capacitor network which may have a constant reference switching frequency.

In the circuit of FIG. 3, the function $V_{out}$ is equal to $-V_{ref}(f_{in}/f_{ref})(C_1/C_2)$.

In this case, if $C_1$ and $C_2$ are identical, the output appears directly as a linear function of the input switching frequency for a set reference frequency, thus performing the frequency to voltage conversion desired.

In a preferred embodiment, the frequency $f_{in}$ may be several times the frequency $f_{ref}$. Each time capacitor $C_1$ is charged by application of the capacitor through the switch to $V_{ref}$ and is thus switched to the negative input of the operational amplifier 20 the charge on capacitor $C_2$ increases with each application of the charge from capacitor $C_1$. When capacitor $C_2$ is ultimately switched to its output position, the voltage is transferred to the input of a sample and hold circuit 21.

In order to generate a $V_{out}/f_{in}$ function with a positive slope, the voltage/frequency characteristic must be made non-linear. This is accomplished by maintaining $V_{in}$ as shown in FIG. 3 at ground potential and applying a reference voltage $V_{ref}$ to the positive input of the operational amplifier. The output voltage would then be a function of the $V_{ref}(1 + F_{in}/F_{ref})(C_1/C_2)$. This function is, of course, non-linear. In a system such as a phase-locked loop, a non-linear transfer characteristic is acceptable. Some applications, particularly telecommunications applications, require a linear positive slope on the $V_{out}/f_{in}$ curve. In devices used in such telecommunications applications, an analog ground is typically generated somewhere between $V_{DD}$ (the most positive power supply) and $V_{SS}$ (the most negative power supply). This analog ground ($V_{AG}$) is typically at $\frac{1}{2}(V_{DD} + V_{SS})$. If this analog ground can be held accurately while sinking or sourcing in current, a positive slope linear voltage/frequency can be generated by grounding the negative input $V_{in}$ and applying $V_{AG}$ to the positive input of the operational amplifier. Then if $V_{in}$ and $V_{out}$ are taken with respect to $V_{AG}$, the resulting slope will be positive and linear.

Figure 4:
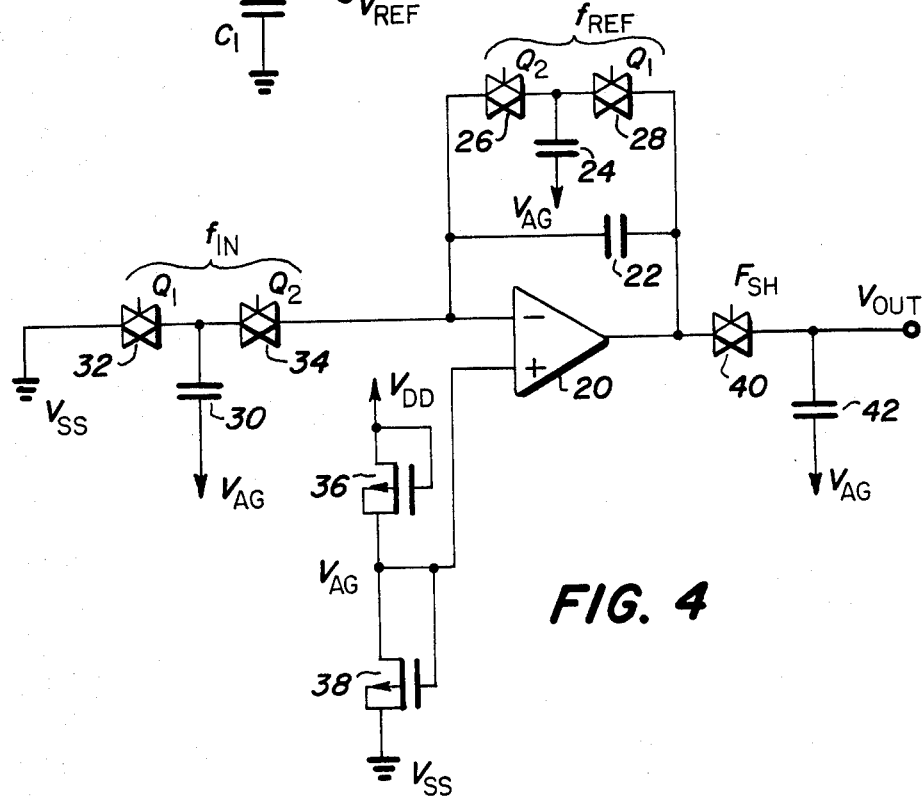
FIG. 4 is a schematic diagram of one MOS implementation of the circuit of FIG. 3.

FIG. 4 shows a typical complimentary MOS (CMOS) implementation of a circuit such as is shown in FIG. 3. An operational amplifier 20 is shown with a capacitor 22 forming one feedback path, and a second feedback path which comprises capacitor 24 and a pair of transmission gates 26 and 28 which are switched on by opposite phases ($\phi 1$, $\phi 2$) of a two phase, non-overlapping clock driven at a frequency $f_{ref}$.

The negative input of the operational amplifier 20 is connected to a capacitor 30 which is switched between an input at $V_{SS}$ potential and the negative input terminal of the operational amplifier 20 by a pair of transmission gates 32 and 34 which are also opened alternately by two non-overlapping phases of a clock with a frequency $f_{in}$.

The positive input to the operational amplifier 20 is connected to a voltage divider network comprising a N-channel transistor 36 having its drain and gate connected to a positive power supply $V_{DD}$, and its source and bulk connected to the drain of an N-channel transistor 38 which has its source connected to the negative voltage supply of the circuit $V_{SS}$. The source and bulk of transistor 36 and drain of transistor 38 are connected together and the node formed thereby is at the analog ground potential $V_{AG}$ which is applied positive input to the operational amplifier 20.

The output of the operational amplifier 20 is connected through a transmission gate 40 to a sample and hold capacitor 42 across which the output voltage $V_{out}$ is taken.

In operation, one plate of capacitor 30 is connected to the analog ground voltage $V_{AG}$ and during phase one of the $F_{in}$ clock, capacitor 30 is charged between $V_{SS}$ and $V_{AG}$ by allowing the transmission gate 32 to conduct. At the end of phase one, transmission gate 32 is rendered non-conductive and transmission gate 34 conducts, thus connecting capacitor 30 to the negative input of operational amplifier 20. Capacitor 22, forming a portion of the feedback network of the operational amlifier 20, is a filtering capacitor of relatively small size, provided merely to absorb the current burst when transmission gate 34 conducts the charge from capacitor 30 to the input of the operational amplifier. The operation of transmission gates 32 and 34 may occur any number of times desired with respect to one operation of transmission gates 26 and 28 depending upon the gain requirement of the particular circuit involved.

Initially, transmission gate 26 is conducting and transmission gate 28 which is operated off the opposite phase of the reference clock F at a frequency $f_{ref}$ is non-conducting. Each time the charge from capacitor 30 is applied to the negative input terminal of the operational amplifier a charge is built up on capacitor 24. After successive charges from capacitor 30 have accumulated on capacitor 24, transmission gate 26 will be rendered non-conductive and transmission gate 28 made conductive in order to transfer the charge on capacitor 24 to the sample and hold capacitor 42. To accomplish this transfer, the sample and hold transmission gate 40 operated at a frequency $f_{sh}$ will be rendered conductive until the charge is transferred to capacitor 42. Transmission gate 40 is then rendered non-conductive to isolate the sample and hold capacitor 42 from the operational amplifier circuit. The output voltage is read across sample and hold capacitor 42.

As noted above, the output voltage $V_{out}$ is equal to the reference voltage (which in this case is $V_{AG}$) times the ratio of the input frequency to the switching frequency of capacitor 24, times the ratio of capacitor 30 to capacitor 34 in size. By selection of appropriate capacitor sizes and frequencies a linear positive slope of the curve $V_{out}$ versus $f_{in}$ is produced, with the slope being proportional to the relative sizes of capacitors 30 and 24.

While specific embodiments of the invention as a whole have been disclosed, many modifications may become apparent to those skilled in the art. The scope of the invention is intended to encompass such modifications and be limited only by the scope of the claims appended hereto.

I claim:

1. A frequency to voltage converter comprising:
   an operational amplifier, having a first and a second input and an output;
   a switched capacitor feedback means connected between the first input and the output of the operational amplifier and being switched at a first frequency to allow the operational amplifier to integrate a signal applied to the input of the operational amplifier;
   capacitor means switchably connected to the first input of the operational amplifier and to a voltage source and to being switched at a second frequency for storing a charge from the voltage source and for tranferring the charge to the input of the operational amplifier, and a reference voltage applied to the second input of the operational amplifier and to one plate of the capacitor means and one plate of the capacitor of the feedback means, whereby the output voltage of the operational amplifier is a function of the first switching frequency and the second switching frequency.

2. A frequency to voltage converter as set forth in claim 1 wherein the capacitor means and the capacitor of the feedback means are equal in size.

3. A frequency to voltage converter as set forth in claim 2 wherein the output of the operational amplifier is connected to a sample and hold circuit.

* * * * *